(12) United States Patent
Wang et al.

(10) Patent No.: US 11,075,288 B2
(45) Date of Patent: Jul. 27, 2021

(54) THIN FILM TRANSISTOR, MANUFACTURING METHOD THEREFOR, ARRAY SUBSTRATE AND DISPLAY PANEL

(71) Applicant: BOE TECHNOLOGY GROUP CO., LTD., Beijing (CN)

(72) Inventors: Guoying Wang, Beijing (CN); Hongda Sun, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/325,981

(22) PCT Filed: Apr. 26, 2018

(86) PCT No.: PCT/CN2018/084627
§ 371 (c)(1),
(2) Date: Feb. 15, 2019

(87) PCT Pub. No.: WO2018/201963
PCT Pub. Date: Nov. 8, 2018

(65) Prior Publication Data
US 2019/0181248 A1     Jun. 13, 2019

(30) Foreign Application Priority Data

May 5, 2017 (CN) .......................... 201710313626.1

(51) Int. Cl.
*H01L 29/66* (2006.01)
*H01L 29/786* (2006.01)
(Continued)

(52) U.S. Cl.
CPC .. *H01L 29/66969* (2013.01); *H01L 21/02554* (2013.01); *H01L 21/02565* (2013.01);
(Continued)

(58) Field of Classification Search
CPC .............. H01L 27/3274; H01L 27/1214–1296
(Continued)

(56) References Cited

U.S. PATENT DOCUMENTS

2005/0158906 A1    7/2005   Sato et al.
2009/0224267 A1    9/2009   Tayanaka
(Continued)

FOREIGN PATENT DOCUMENTS

CN     101478005 A    7/2009
CN     102122620 A    7/2011
(Continued)

OTHER PUBLICATIONS

International Search Report of PCT/CN2018/084627 in Chinese, dated Jul. 31, 2018, with English translation.
(Continued)

*Primary Examiner* — Walter H Swanson
(74) *Attorney, Agent, or Firm* — Collard & Roe, P.C.

(57) ABSTRACT

A thin film transistor is provided and includes an active layer, a source electrode, a drain electrode, a gate electrode and a gate electrode insulating layer, the active layer includes a source electrode region, a drain electrode region and a channel region, the source electrode region and the drain electrode region include a first metal material, and the channel region includes a semiconductor material made from oxidation of the first metal material.

8 Claims, 8 Drawing Sheets

(51) Int. Cl.
  *H01L 21/02* (2006.01)
  *H01L 29/45* (2006.01)
  *H01L 21/027* (2006.01)
  *H01L 21/44* (2006.01)
  *H01L 21/033* (2006.01)

(52) U.S. Cl.
  CPC ........ *H01L 21/02614* (2013.01); *H01L 29/45* (2013.01); *H01L 29/7869* (2013.01); *H01L 21/0272* (2013.01); *H01L 21/0331* (2013.01); *H01L 21/44* (2013.01)

(58) Field of Classification Search
  USPC .......................................................... 257/43
  See application file for complete search history.

(56) References Cited

U.S. PATENT DOCUMENTS

| | | |
|---|---|---|
| 2014/0011329 A1 | 1/2014 | Zhang et al. |
| 2017/0110591 A1 | 4/2017 | Bang et al. |
| 2017/0317195 A1 | 11/2017 | Zhang et al. |
| 2018/0090601 A1 | 3/2018 | Yan et al. |
| 2019/0181248 A1 | 6/2019 | Wang et al. |
| 2019/0214485 A1 | 7/2019 | Wang et al. |

FOREIGN PATENT DOCUMENTS

| | | | |
|---|---|---|---|
| CN | 104282576 A | | 1/2015 |
| CN | 105529275 A | | 4/2016 |
| CN | 106128963 A | | 11/2016 |
| CN | 106129123 | * | 11/2016 |
| CN | 106935658 A | | 7/2017 |

OTHER PUBLICATIONS

Notice of Transmittal of the International Search Report of PCT/CN2018/084627 in Chinese, dated Jul. 31, 2018.
Written Opinion of the International Searching Authority of PCT/CN2018/084627 in Chinese, dated Jul. 31, 2018 with English translation.
Chinese Office Action in Chinese Application No. 201710313626.1, dated Jun. 20, 2019 with English translation.
Chinese Office Action in Chinese Application No. 201710313626.1, dated May 18, 2020 with English translation.

* cited by examiner

Fig. 2(b)
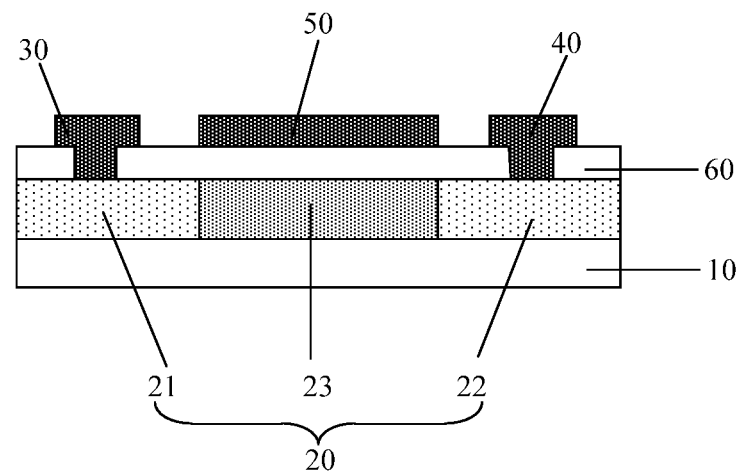
Fig. 2(c)
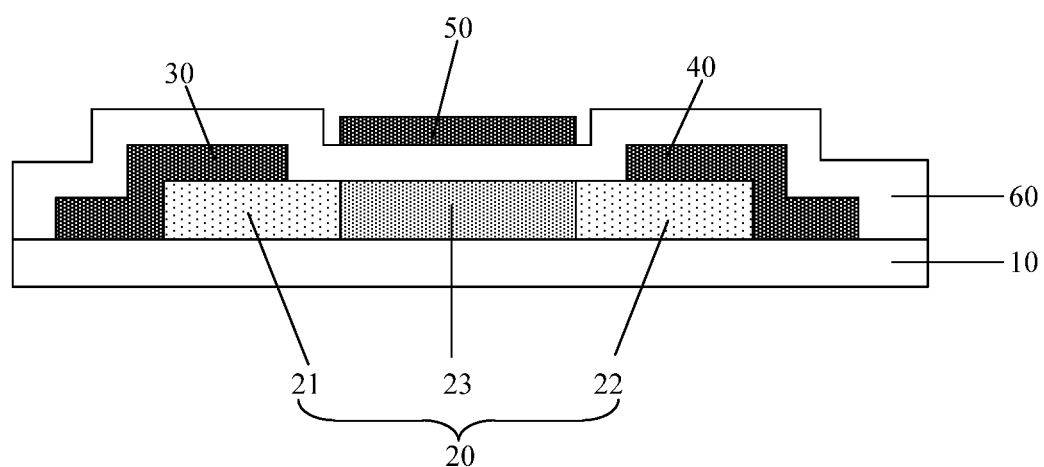
Fig. 2(d)

THIN FILM TRANSISTOR, MANUFACTURING METHOD THEREFOR, ARRAY SUBSTRATE AND DISPLAY PANEL

CROSS REFERENCE TO RELATED APPLICATIONS

This application is the National Stage of PCT/CN2018/084627 filed on Apr. 26, 2018, which claims priority under 35 U.S.C. § 119 of Chinese Application No. 201710313626.1 filed on May 5, 2017, the disclosure of which is incorporated by reference.

TECHNICAL FIELD

Embodiments of the present disclosure relate to a thin film transistor and a manufacturing method thereof, an array substrate and a display panel.

BACKGROUND

In recent years, with the continuous development of types of display technologies such as LCD (liquid crystal display) display technology, OLED (organic light-emitting diode) display technology and flexible display technology, large-size and high-resolution display panel products have emerged one after another. Conventional silicon-base thin film transistors are not able to satisfy actual demands due to a low mobility, and metal oxide thin film transistors attract a wide attention because of advantages such as high mobility, good uniformity and simple manufacturing process.

SUMMARY

Embodiments of the present disclosure provide a thin film transistor, including an active layer, a source electrode, a drain electrode, a gate electrode and a gate insulating layer. The active layer includes a source region, a drain region and a channel region; the source region and the drain region include a first metal material, and the channel region includes a semiconductor material which is obtained from oxidation of the first metal material.

For example, the source region, the drain region and the channel region are provided in a one-piece manner and formed from the first metal material.

For example, the gate electrode, the gate insulating layer and the channel region are in a same pattern.

For example, the thin film transistor further includes a base substrate and a passivation layer. The active layer, the gate insulating layer and the gate electrode are sequentially arranged from bottom to top on the base substrate, the passivation layer is on a side of the gate electrode away from the gate insulating layer, and the source electrode and the drain electrode are respectively electrically connected with the source region and the drain region through via holes passing through the passivation layer.

For example, the thin film transistor further includes a source contact region and a drain contact region. The source contact region and the drain contact region are respectively electrically connected with the source region and the drain region; the source contact region and the drain contact region include a second metal material and the gate insulating layer includes an insulating material which is obtained from oxidation of the second metal material.

For example, the source contact region, the drain contact region and the gate insulating layer are provided in a one-piece manner and formed from the second metal material.

For example, the thin film transistor further includes a passivation layer. The passivation layer is on a side of the gate electrode away from the gate insulating layer, and the source electrode and the drain electrode are respectively electrically connected with the source contact region and the drain contact region through via holes passing through the passivation layer. For example, the second metal material includes aluminum, titanium, tantalum, hafnium or zirconium; or the second metal material includes an alloy material including aluminum, titanium, tantalum, hafnium or zirconium.

For example, the first metal material includes indium, zinc, tin, copper, nickel, titanium or tungsten; or the first metal material includes an alloy material including indium, zinc, tin, copper, nickel, titanium or tungsten.

Embodiments of the present disclosure further provide a manufacturing method of a thin film transistor including forming an active layer. Forming the active layer includes: forming a first metal layer, which includes a source region, a drain region and a middle region between the source region and the drain region, and form a semiconductor material by performing an oxidation treatment to the middle region, so as to form a channel region.

For example, a material of the first metal layer includes indium, zinc, tin, copper, nickel, titanium or tungsten; or the material of the first metal layer includes an alloy material including indium, zinc, tin, copper, nickel, titanium or tungsten.

For example, the oxidation treatment includes conducting an anodic oxidation process to perform the oxidization treatment.

For example, forming the active layer further includes: forming a photoresist layer on the first metal layer before the oxidation treatment, so that the photoresist layer exposes the middle region; and performing the oxidation treatment to the middle region by using the photoresist layer as a mask.

For example, the manufacturing method further includes: sequentially forming an insulating layer and a gate electrode layer on the photoresist layer, and then lifting off the photoresist layer to form a gate insulating layer and a gate electrode.

For example, the manufacturing method further includes: sequentially forming a passivation layer, a source electrode and a drain electrode on the gate electrode, wherein the source electrode and the drain electrode are respectively electrically connected with the source region and the drain region through via holes passing through the passivation layer.

For example, the manufacturing method further includes: forming a second metal layer before forming the photoresist layer, wherein the second metal layer is stacked on the first metal layer, and the first metal layer and the second metal layer are formed in a same patterning process.

For example, a portion of the second metal layer covers the middle region of the active layer and is defined as a gate insulating region; the manufacturing method further includes: in performing the oxidation treatment to the middle region, oxidizing the gate insulating region to form the gate insulating layer.

For example, the manufacturing method further includes: sequentially forming a passivation layer, a source electrode and a drain electrode on the gate electrode, wherein the source electrode and the drain electrode are respectively electrically connected with the second metal layer through via holes passing through the passivation layer.

For example, a material of the second metal layer includes aluminum, titanium, tantalum, hafnium or zirconium; or the material of the second metal layer includes an alloy material including aluminum, titanium, tantalum, hafnium or zirconium.

For example, a material of the first metal layer includes indium, zinc, tin, copper, nickel, titanium or tungsten; or the material of the first metal layer includes an alloy material including indium, zinc, tin, copper, nickel, titanium or tungsten.

Embodiments of the present disclosure further includes an array substrate, including the above thin film transistor.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2(c) is a third schematic view of the thin film transistor provided by the embodiments of the present disclosure;

FIG. 2(d) is a fourth schematic view of the thin film transistor provided by the embodiments of the present disclosure;

REFERENCE SIGNS

10—base substrate; 20—active layer; 21—source region; 22—drain region; 23—channel region; 24—first metal layer; 25—photoresist layer; 30—source electrode; 40—drain electrode; 50—gate electrode; 51—metal film; 60—gate insulating layer; 62—insulating film; 70—passivation layer; 80—second metal layer; 81—source contact region; 82—drain contact region; 400—array substrate; 401—pixel unit; 6—data driving circuit; 7—gate driving circuit; 61—data line; 71—gate line.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

It should be noted that structures being "provided in a one-piece manner" mentioned in the present disclosure means that the structures are formed by a same deposition process and formed from a same material to form a continuous or integrated structure.

"On" mentioned in embodiments of the present disclosure relates to a sequence during forming a thin film transistor. For any two layers, the one formed later is on the other one that is formed first.

Figure 1:
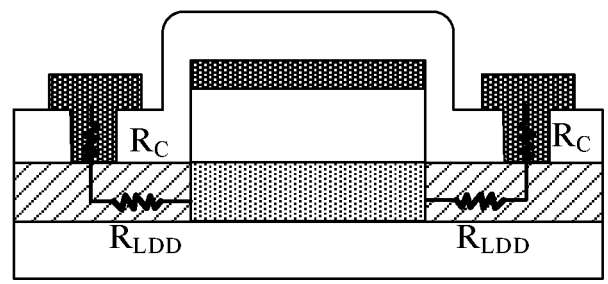
FIG. 1 is a schematic view of a thin film transistor.

During manufacturing a metal oxide thin film transistor, a high-resistance metal oxide semiconductor active layer is usually formed first, and then a region that is included by the active layer and is in contact with a source electrode and another region that is included by the active layer and is in contact with a drain electrode are treated to become conductive, so that the parasitic resistance between a channel region and the source electrode/drain electrode is reduced. Usually those skilled in the art perform a plasma treatment to both the region that is included by the active layer and is in contact with the source electrode and the region that is included by the active layer and is in contact with the drain electrode with a gas, for example, argon or helium or the like, so that these regions (contact regions) become conductive. This method may result in parasitic resistance generated between the source electrode/drain electrode and the channel region. As illustrated in FIG. 1, the parasitic resistance is Rp=2RC+2RLDD, wherein RC is contact resistance between the source electrode/drain electrode and the active layer, and RLDD is resistance of the regions that become conductive and are included by the active layer.

Embodiments of the present disclosure provide a thin film transistor, as illustrated in FIGS. 2(a)-2(d), and the thin film transistor includes an active layer 20, a source electrode 30, a drain electrode 40, a gate electrode 50 and a gate insulating layer 60 which are on a base substrate 10. The active layer 20 includes a source region 21, a drain region 22 and a channel region 23 between the source region 21 and the drain region 22. The source region 21 and the drain region 22 include a first metal material, and the channel region 23 includes a semiconductor material which is obtained from oxidation of the first metal material.

For example, the source region 21, the drain region 22 and the channel region 23 are provided in a one-piece manner and formed from the first metal material.

Figure 2A:
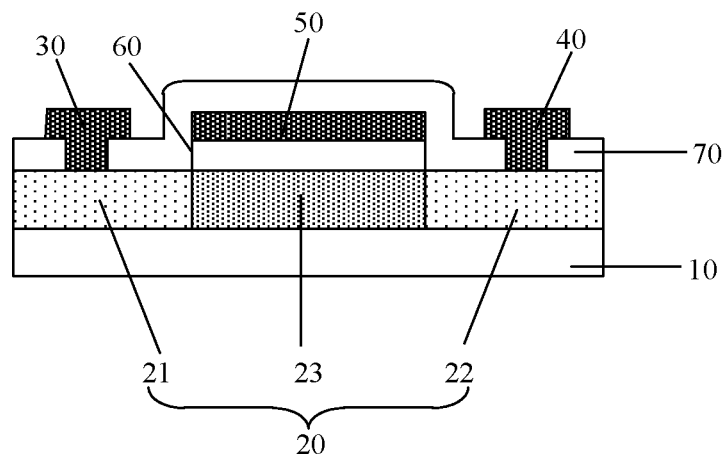
FIG. 2(a) is a first schematic view of a thin film transistor provided by the embodiments of the present disclosure.
Figure 2B:
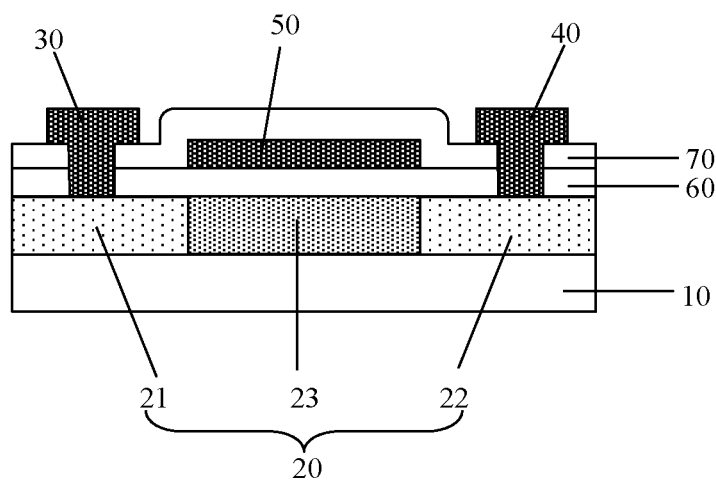
FIG. 2(b) is a second schematic view of the thin film transistor provided by the embodiments of the present disclosure.

The specific structures and shapes of the film layers on the base substrate 10 are not limited to the embodiments of the present disclosure, and can be any one as illustrated in FIGS. 2(a)-2(d). For example, as illustrated in FIGS. 2(a)-2(c), the source electrode 30 and the drain electrode 40 are disposed in a same layer and are separated by an insulating layer, and the source electrode 30 and the drain electrode 40 are respectively in contact with the source region 21 and the drain region 22 through via holes passing through the insulating layer. The insulating layer can be a passivation layer 70 as illustrated in FIG. 2(a), or can be a gate insulating layer 60 as illustrated in FIG. 2(c), or can include the passivation layer 70 and the gate insulating layer 60 as illustrated in FIG. 2(b). As illustrated in FIG. 2(d), the source electrode 30 and the drain electrode 40 can alternatively be disposed in a same layer, and the source electrode 30 and the drain electrode 40 are in direct contact with the source region 21 and the drain region 22, respectively. Other structures which can ensure a performance of the thin film transistor will also work.

For example, the gate electrode 50 and the gate insulating layer 60 are in a same pattern.

For example, the gate electrode 50, the gate insulating layer 60 and the channel region 23 are all in the same pattern.

A thickness of the active layer 20 is not limited to embodiments of the present disclosure, and can be but not limited to 20 nm-100 nm, for example.

For example, a material of the base substrate 10 can be a flexible base substrate, a glass base substrate or other base substrates.

Embodiments of the present disclosure provide the thin film transistor, and the source region 21 and the drain region 22 of the active layer 20 of the thin film transistor are of the metal material, which can efficiently reduce the parasitic resistance Rp between the source electrode 30/drain electrode 40 and the channel region 23.

Additionally, the source region 21 and the drain region 22 of the active layer 20 in the present disclosure are directly formed of the metal material, a process of making the source region 21 and the drain region 22 conductive is omitted, the process is simplified, the cost is reduced and the mobility and stability of the device is improved. Further, a case that an inferior process of making the source region 21 and the drain region 22 conductive influences the performance of the thin film transistor is avoided, and the product yield is improved.

For example, as illustrated in FIG. 2(a), the active layer 20, the gate insulating layer 60, the gate electrode 50, the passivation layer 70, and the source electrode 30/drain electrode 40 are sequentially arranged from bottom to top on the base substrate 10. The source electrode 30 and the drain electrode 40 are respectively in contact with the source region 21 and the drain region 22 through via holes passing through the passivation layer 70. The gate electrode 50, the gate insulating layer 60 and the channel region 23 are in the same pattern.

For example, the first metal material, that is, the material of the source region 21 and the drain region 22, can be a single metal, an alloy material, or a doped metal. For example, the first metal material can be indium (In), zinc (Zn), tin (Sn), copper (Cu), nickel (Ni), titanium (Ti) or tungsten (W); or the first metal material can be an alloy material including indium (In), zinc (Zn), tin (Sn), copper (Cu), nickel (Ni), titanium (Ti) or tungsten (W). A material of the channel region 23 is a metal oxide semiconductor material obtained from oxidation of the above metal material, for example, indium oxide ($In_2O_3$), zinc oxide (ZnO), indium tin oxide (ITO), aluminum zinc oxide (AZO), zinc tin oxide (ZTO), indium gallium zinc oxide (IGZO) or the like.

For example, a material of the gate insulating layer 60 can be an insulating material, for example, silicon oxide, silicon nitride, silicon oxynitride or the like. A material of the gate electrode 50, the source electrode 30 and the drain electrode 40 can be a commonly-used metal, for example, molybdenum (Mo), aluminum (Al), titanium (Ti), gold (Au), copper (Cu), hafnium (Hf), tantalum (Ta) or the like. A material of the passivation layer 70 can be an insulating material, for example, silicon oxide, silicon nitride, silicon oxynitride or the like.

The gate electrode 50 and the gate insulating layer 60 are in the same pattern in embodiments of the present disclosure, so that the gate electrode 50 does not overlap with a low-resistance region (the source region 21 and the drain region 22) of the active layer 20, a relatively small parasitic capacitance is generated between the gate electrode 50 and the active layer 20 and a resistance of the active layer 20 is reduced. As a result, signal delay is alleviated and display effect is improved.

Figure 3:
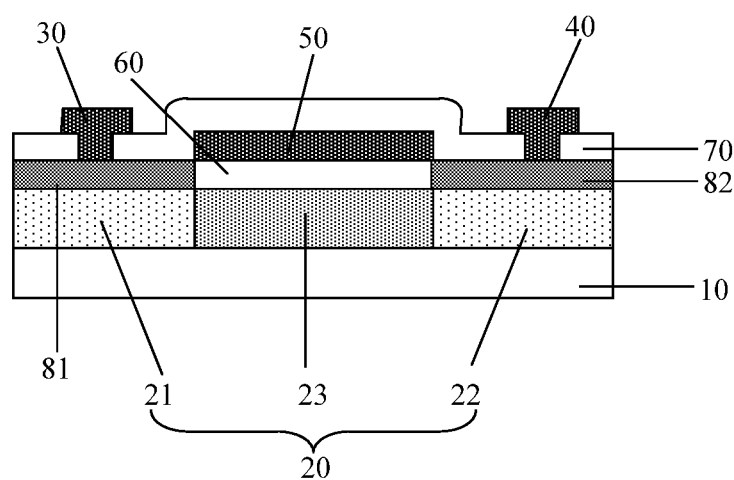
FIG. 3 is a fifth schematic view of the thin film transistor provided by the embodiments of the present disclosure.

FIG. 3 is a schematic view of the thin film transistor provided by another embodiment of the present disclosure. The thin film transistor of this embodiment differs from that of the embodiment as illustrated in FIG. 2(a) in that the thin film transistor further includes a source contact region 81 and a drain contact region 82. The source contact region 81 and the drain contact region 82 include a second metal material, and the gate insulating layer 60 includes an insulating material which is obtained from oxidation of the second metal material. The source contact region 81 and the drain contact region 82 are respectively electrically connected with the source region 21 and the drain region 22. For example, in this embodiment, the source contact region 81 and the drain contact region 82 are respectively connected with the source region 21 and the drain region 22 through direct contact.

For example, the source contact region 81, the drain contact region 82 and the gate insulating layer 60 are provided in a one-piece manner and formed from the second metal material.

As illustrated in the figure, the source contact region 81, the drain contact region 82 and the gate insulating layer 60 are disposed in a same layer, and respectively cover and contact the source region 21, the drain region 22 and the channel region 23 of the active layer 20; that is, orthographic projections of the source contact region 81, the drain contact region 82 and the gate insulating layer 60 on the base substrate 10 respectively coincide with orthographic projections of the source region 21, the drain region 22 and the channel region 23 on the base substrate 10. The source electrode 30 and the drain electrode 40 are respectively electrically connected with the source contact region 81 and the drain contact region 82 through via holes passing through the passivation layer 70, so as to respectively establish an electrical connection with the source region 21 and the drain region 22.

A thickness of the gate insulating layer 60 is not limited. For example, the thickness of the gate insulating layer 60 can be but not limited to 100 nm-200 nm.

For example, the second metal material, that is, the material of the source contact region 81 and the drain contact region 82, can be a single metal, an alloy material, or a doped metal. For example, the second metal material can be aluminum, titanium, tantalum, hafnium or zirconium, or can be an alloy material including aluminum, titanium, tantalum, hafnium or zirconium. Accordingly, the material of the gate insulating layer 60 is an oxide of the above metal material, for example, the material of the gate insulating layer 60 can be a high dielectric constant (high-K) metal oxide insulating material, for example, aluminum oxide, titanium oxide, tantalum oxide, hafnium oxide or zirconium oxide, or the like.

Figure 4:
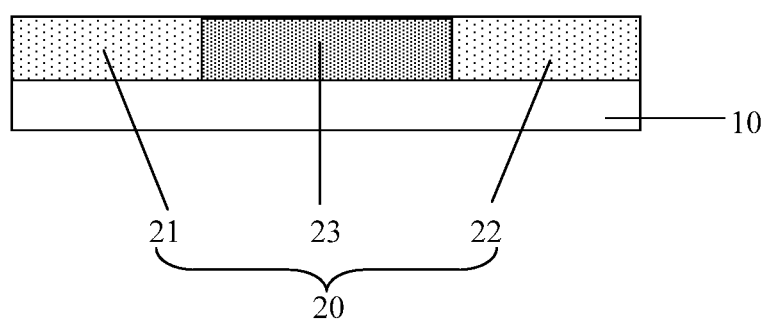
FIG. 4 is a view illustrating a first step of a manufacturing method of the thin film transistor provided by the embodiments of the present disclosure.

Embodiments of the present disclosure further provide a manufacturing method of the thin film transistor, which includes forming the active layer. As illustrated in FIG. 4, forming the active layer includes following steps.

A first metal layer 24 is formed on the base substrate 10, and the first metal layer includes the source region 21, the drain region 22 and the middle region between the source region 21 and the drain region 22; and the semiconductive channel region 23 is formed by performing the oxidation treatment to the middle region, so as to form the active layer 20. The source region 21 and the drain region 22 are not oxidized and preserve electrical conductivity.

Here, a manner of the oxidation treatment is not limited, as long as the middle region of the first metal layer can be fully oxidized.

Embodiments of the present disclosure provide the manufacturing method of the thin film transistor. By performing the oxidation treatment to the first metal layer to form the metal oxide semiconductor, that is the channel region 23; and the source region 21 and the drain region 22 are formed of the metal having a low-resistance without being subjected to the oxidation treatment, the source region 21 and the drain region 22 are disposed at two ends of the channel region 23 and are directly connected with the channel region 23. A process of rendering the active layer 20 conductive is avoided and meanwhile the source region 21 and the drain region 22 are guaranteed to be a low-resistance metal, which simplifies the process, saves the manufacturing cost, and further effectively reduces the contact resistance $R_C$ of the source electrode/drain electrode and the resistance $R_{LDD}$ of a LDD (light-doped drain) region, as well as the parasitic resistance $R_P$ between the source electrode/drain electrode and the channel region.

The manufacturing method of the thin film transistor provided by embodiments of the present disclosure is described combined with specific embodiments below.

It should be noted that a patterning process of the present disclosure can include a photolithographic process, or include the photolithographic process and an etching step (the etching step can be dry etch or wet etch), or can include other process which can form a predetermined pattern such as printing, jet ink or the like. The photolithographic process means a process which includes process steps such as film formation, exposure, development and the like, which uses photoresist, a mask, an exposure machine to form a pattern. A patterning process can be chosen according to the structure to be formed in the present disclosure.

Figure 5:
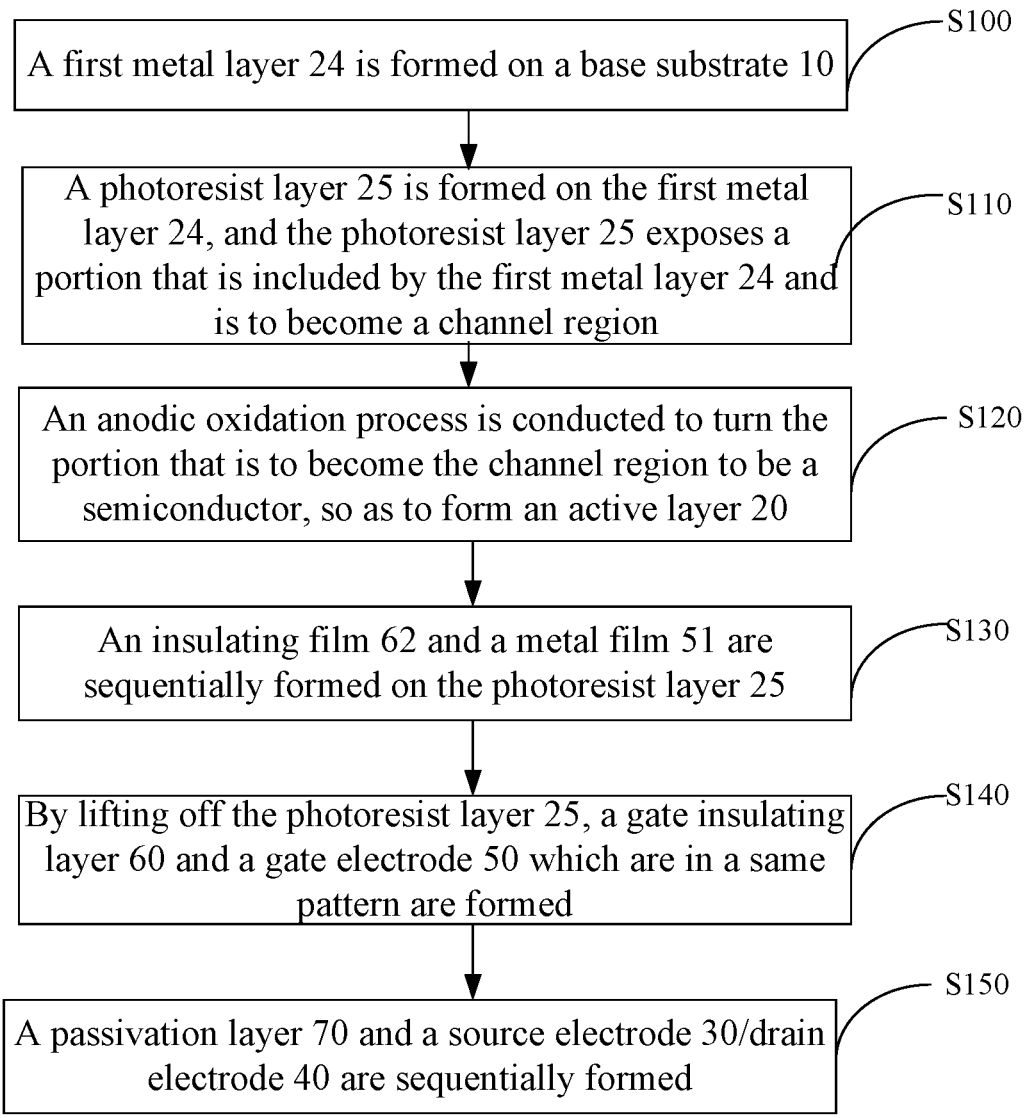
FIG. 5 is a first flow chart of the manufacturing method of the thin film transistor provided by the embodiments of the present disclosure.

Embodiments of the present disclosure provide the manufacturing method of the thin film transistor which is illustrated in FIG. 5, and the manufacturing method includes following steps in detail.

Figure 6A:
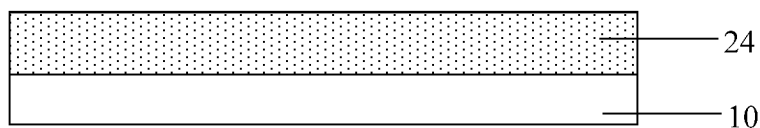
FIGS. 6(a)-6(e) are views illustrating a second step of the manufacturing method of the thin film transistor provided by the embodiments of the present disclosure.

S100, as illustrated in FIG. 6(a), the first metal layer 24 is formed on the base substrate 10.

For example, a first metal film and a first photoresist layer covering the first metal film are sequentially formed on the base substrate 10; the first photoresist layer is exposed and developed, which allows a remaining part of the first photoresist layer to cover a region where a pattern of the first metal layer is to be formed; and then the first metal film is etched to form the first metal layer 24.

For example, the first metal film with a thickness of 20 nm-100 nm can be formed through magnetron sputtering, direct current sputtering or evaporation or the like. A material of the first metal film can be indium, zinc, tin, copper, nickel, titanium or tungsten or can be an alloy material including indium, zinc, tin, copper, nickel, titanium or tungsten.

Figure 6B:
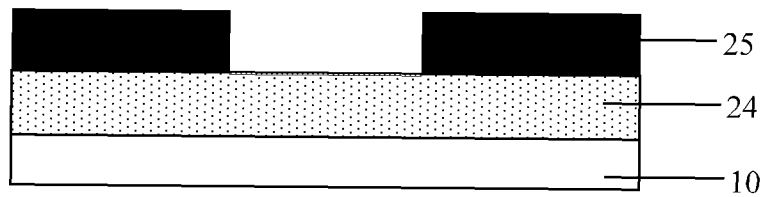

S110, as illustrated in FIG. 6(b), a photoresist layer 25 is formed on the first metal layer 24 and exposes a portion of the first metal layer 24, and the portion of the first metal layer 24 is to become the channel region (i.e. the above middle region).

Exemplarily, after the first metal layer 24 is formed, a remaining photoresist (the remaining part of the first photoresist layer) is not lifted off but is exposed and developed to form the photoresist layer 25, so that the portion that is included by the first metal layer 24 and is to become the channel region is exposed. For example, an additional photoresist can be formed, then exposed and developed to form the photoresist layer 25, which exposes the portion to become the channel region.

Figure 6C:
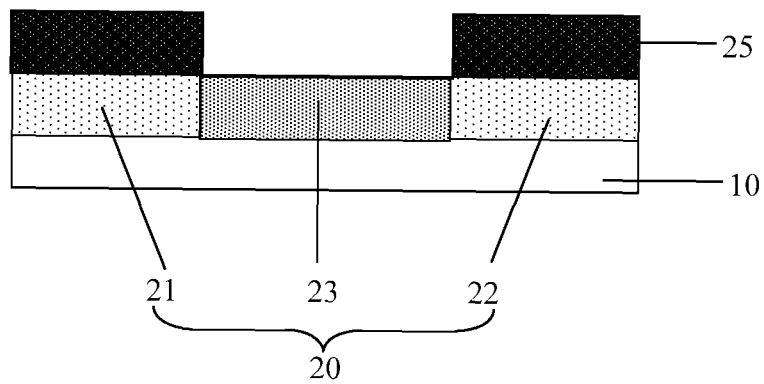

S120, as illustrated in FIG. 6(c), the anodic oxidation process is conducted to treat the portion to become the channel region and to make the material of the portion to become the channel region become semiconductor, so as to form the channel region 23. Portions that are not oxidized and are included by the first metal layer 24 form the source region 21 and the drain region 22, so as to form the active layer 20.

For example, in order to apply the thin film transistor in a flexible display panel and broad an application range of the thin film transistor, the anodic oxidation process can be performed at normal atmosphere pressure and at room temperature to the portion that is exposed and is included by the first metal layer 24. The anodic oxidation process can use a citric acid solution and a constant current and constant voltage mode, and an electrolysis method can be used to oxidize the metal to a metal oxide.

For example, the material of the channel region 23 can be ZnO, $In_2O_3$, IZO, ZTO, ITO, IGZO or the like.

Figure 6D:
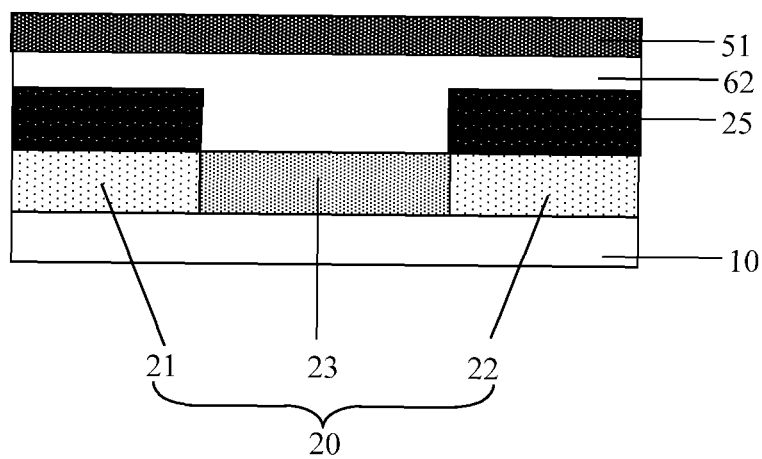

S130, as illustrated in FIG. 6(d), an insulating film 62 and a gate electrode layer are sequentially formed on the photoresist layer 25. The gate electrode layer is a metal film 51, for example.

For example, the insulating film 62 with a thickness of 100 nm-400 nm can be formed using plasma enhanced chemical vapor deposition (PECVD), chemical vapor deposition (CVD) or the like. A material of the insulating film 62 can be at least one selected from the group consisting of silicon oxide, silicon nitride and silicon oxynitride and the like.

For example, the metal film 51 with a thickness of 100 nm-200 nm can be formed using a method such as the direct current sputtering or the like. A material of the metal film can be Mo, Al, Ti, Au, Cu, Hf, Ta or the like.

Figure 6E:
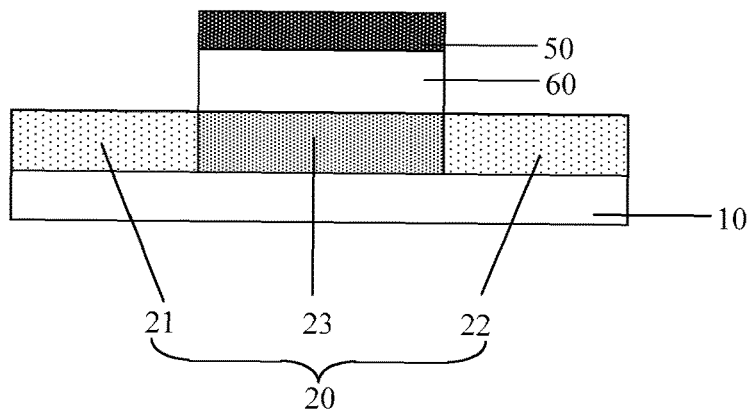

S140, as illustrated in FIG. 6(e), the gate insulating layer 60 and the gate electrode 50 that have the same pattern are formed by lifting off the photoresist layer 25.

S150, as illustrated in FIG. 2(a), the passivation layer 70 and the source electrode 30/the drain electrode 40 are sequentially formed. The source electrode 30 and the drain electrode 40 respectively contact the source region 21 and the drain region 22 through via holes in the passivation layer 70.

For example, the passivation layer 70 can be formed with a same material and a same process as the gate insulating layer 60.

The source electrode 30 and the drain electrode 40 can be formed with a same material and a same process as the gate electrode 50.

Embodiments of the present disclosure provide the thin film transistor, and the source region 21, the drain region 22 and the channel region 23 of the active layer 20 of the thin film transistor are provided in a one-piece manner and formed from a metal material. The channel region 23 which is a semiconductor is directly connected with the source region 21 and the drain region 23 which each are a metal, and this can effectively reduce the parasitic resistance Rp between the source electrode 30/drain electrode 40 and the channel region 23.

Here, the photoresist layer 25 exposing the portion to become the channel region is formed on the base substrate 10 on which the active layer 20 is formed. During treating the portion to become the channel region, the photoresist layer 25 can protect the source region and the drain region from being oxidized. The method is simple and the cost is low.

Additionally, the insulating film 62 and the metal film 51 are sequentially formed on the base substrate 10, on which the photoresist layer 25 is formed, and the gate insulating layer 60 and the gate electrode 50 of a self-aligned top gate thin film transistor is formed through directly lifting off the photoresist layer 25. Compared with a conventional technology, the manufacturing process is simplified, and an offset (a lateral undercut or lateral erosion) defect caused by forming the gate insulating layer 60 and the gate electrode 50 with the wet etching process is avoided, so that the parasitic resistance of the source electrode/drain electrode is effectively reduced and the performance of the thin film transistor is improved.

Figure 7:
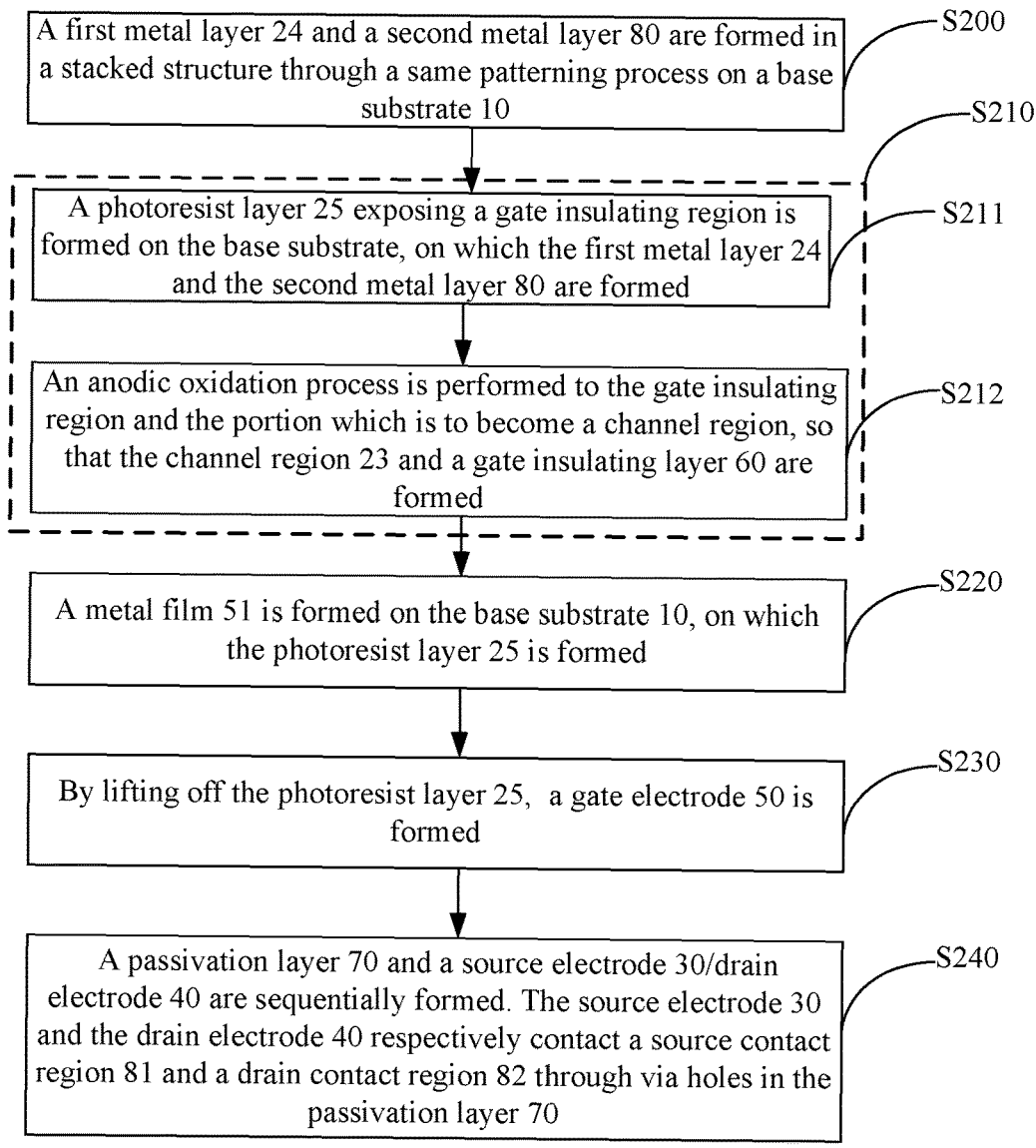
FIG. 7 is a second flow chart of the manufacturing method of the thin film transistor provided by the embodiments of the present disclosure.

Embodiments of the present disclosure further provide the manufacturing method of the thin film transistor which includes following steps, as illustrated in FIG. 7.

Figure 8A:
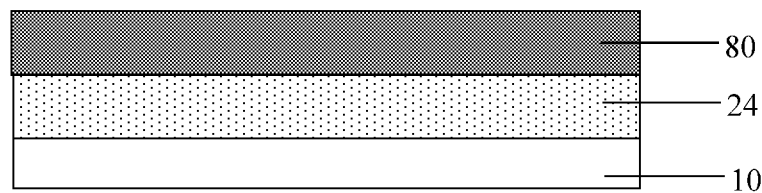
FIGS. 8(a)-8(e) are views illustrating a third step of the manufacturing method of the thin film transistor provided by the embodiments of the present disclosure.

S200, as illustrated in FIG. 8(a), the first metal layer 24 and a second metal layer 80 are formed in a stacked structure through a same patterning process on the base substrate 10.

For example, the first metal layer 24 and the second metal layer 80 are formed through deposition processes which are continuous, that is, no interlayer is formed between the first metal layer 24 and the second metal layer 80. For example, the first metal layer 24 and the second metal layer 80 can be continuously formed during one sputtering process through switching sputtering targets, without opening a sputtering chamber midway.

For example, the first metal layer with a thickness of 20 nm-100 nm can be formed through magnetron sputtering, direct current sputtering or evaporation or the like. The material of the first metal layer can be indium, zinc, tin, copper, nickel, titanium, tungsten, indium tin, indium zinc, zinc tin, indium zinc tin or the like.

For example, the second metal layer with a thickness of 100 nm-200 nm can be formed through the same process as the first metal layer, and a material of the second metal layer can be Al, Ti, Ta, Hf, Zr or the like.

Figure 8B:
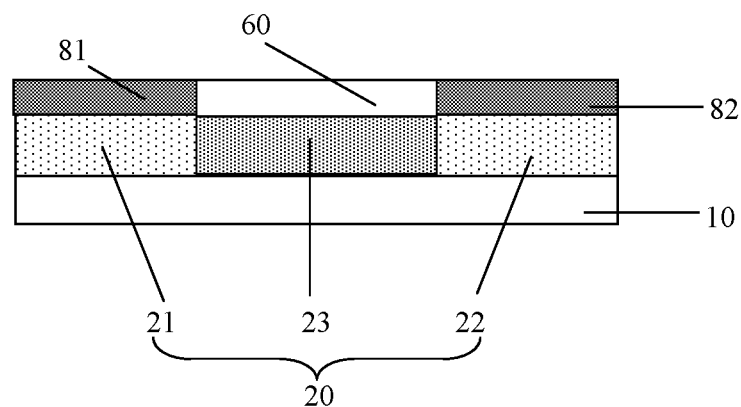

S210, as illustrated in FIG. 8(b), a portion of the second metal layer 80 is defined as a gate insulating region, and the portion of the second metal layer 80 covers the middle region (i.e. the portion to become the channel region) of the first metal layer 24. Meanwhile the middle region of the first metal layer 24 and the gate insulating region of the second metal layer 80 are treated with the oxidization treatment, so that a material of the middle region is turned to be a semiconductor to form the channel region 23, and a material of the gate insulating region is turned to be an insulator to form the gate insulating layer 60.

The portion that is oxidized to be the semiconductor and included by the first metal layer 24 functions as the channel region 23 of the active layer 20, the portions that are included by the first metal layer 24 and are not oxidized function as the source region 21 and the drain region 22, so that the active layer 20 is formed.

The portion that is oxidized to be the insulator and included by the second metal layer 80 functions as the gate insulating layer 60, and the portions that are included by the second metal layer 80 and are not oxidized function as a source contact region 81 and a drain contact region 82, which are respectively configured to contact the source electrode 30 and the drain electrode 40.

For example, the step S210 for forming the active layer 20 and the gate insulating layer 60 includes a step S211 and a step S212.

Figure 8C:
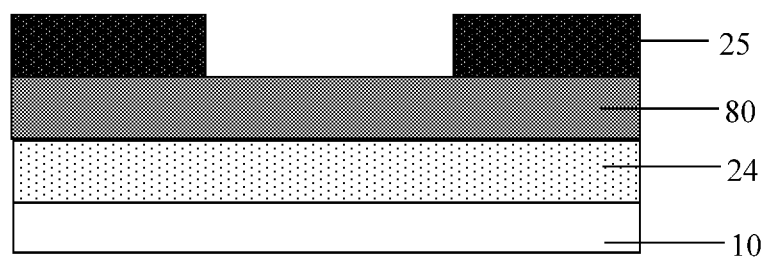

S211, as illustrated in FIG. 8(c), the photoresist layer 25 exposing the gate insulating region is formed on the base substrate, on which the first metal layer 24 and the second metal layer 80 are formed.

S212, as illustrated in FIG. 8(b), the anodic oxidation process is performed to the portion to become the channel region and the gate insulating region, so that the channel region 23 and the gate insulating layer 60 are formed.

Figure 8D:
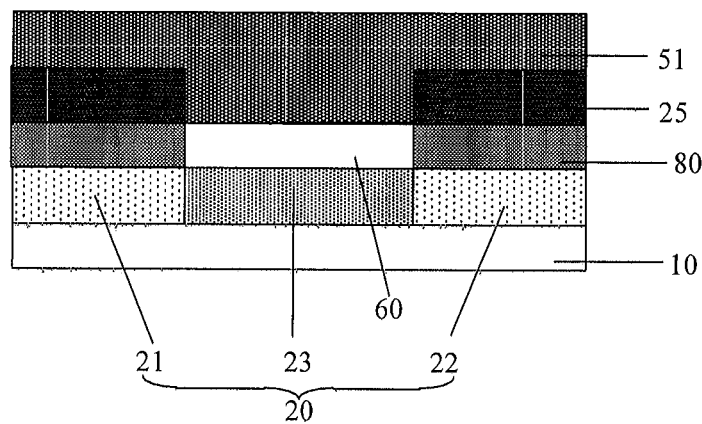

S220, as illustrated in FIG. 8(d), the gate electrode layer is formed on the base substrate 10, on which the photoresist layer 25 is formed. For example, the gate electrode layer is the metal film 51.

For example, the metal film 51 with the thickness of 100 nm-20 nm can be formed using a method such as the direct current sputtering or the like. The material of the metal film 51 can be Mo, Al, Ti, Au, Cu, Hf, Ta or the like.

Figure 8E:
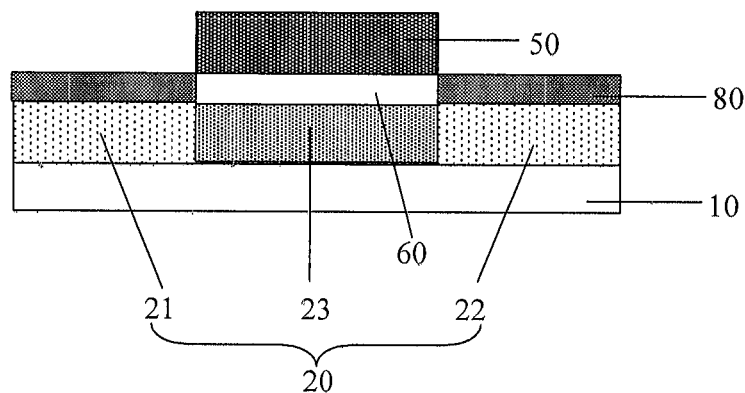

S230, as illustrated in FIG. 8(e), by removing the photoresist layer 25, the gate electrode 50 is formed.

S240, as illustrated in FIG. 3, the passivation layer 70 and the source electrode 30/the drain electrode 40 are sequentially formed. The source electrode 30 and the drain electrode 40 respectively contact the source contact region 81 and the drain contact region 82 through via holes in the passivation layer 70, so as to respectively establish an electrical connection with the source region 21 and the drain region 22.

For example, the passivation layer 70 can be formed using the plasma enhanced chemical vapor deposition (PECVD), the chemical vapor deposition (CVD) or the like. The material of the insulating film 62 with the thickness of 100 nm-400 nm can be at least one of insulating materials such as silicon oxide, silicon nitride and silicon oxynitride and the like.

For example, the source electrode 30 and the drain electrode 40 can be formed with the same process and the same material as forming the gate electrode 50.

Embodiments of the present disclosure provide the manufacturing method of the thin film transistor, the source region 21 and the drain region 22 of the active layer 20 of the thin film transistor are directly formed by a metal material; the channel region which is a semiconductor is directly connected with the source region and the drain region which each are a metal, and this can effectively reduce the parasitic resistance Rp between the source electrode 30/drain electrode 40 and the channel region 23.

Here, the first metal layer 24 and the second metal layer 81 are continuously formed on the base substrate 10 and then are treated with the oxidization treatment to form the active layer 20 and the gate insulating layer 60. In this way, a plasma bombardment to a back channel region during depositing a gate dielectric on the active layer 20 using a plasma chemical vapor deposition can be avoided and the back channel region of the active layer is effectively protected. Meanwhile a gate control capability is increased and a device performance is improved.

Additionally, the photoresist layer 25 exposing the gate insulating region is formed on the base substrate 10. During treating the gate insulating region to become the gate insulating layer and the portion to become the channel region with the oxidization treatment, the photoresist layer 25 can protect the source region and the drain region from being oxidized. The method is simple and the cost is low.

Embodiments of the present disclosure further provide an array substrate which includes the above thin film transistor.

Figure 9:
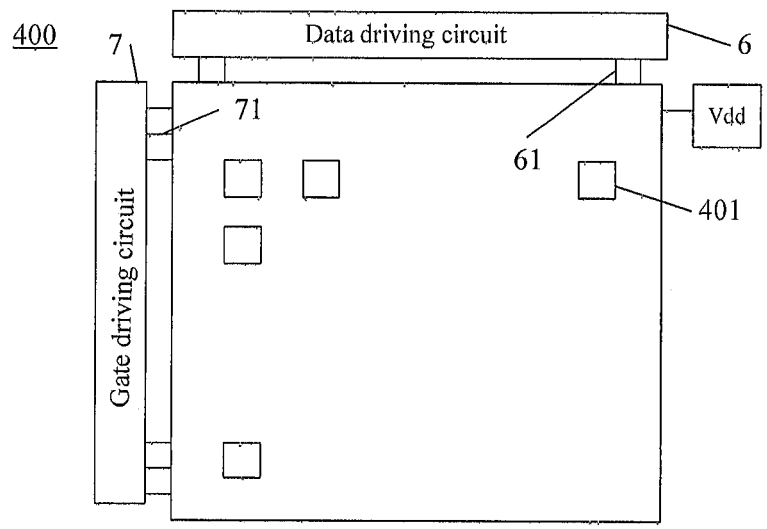
FIG. 9 is a schematic view of an array substrate provided by the embodiments of the present disclosure.

For example, the array substrate is an organic light-emitting diode array substrate. As illustrated in FIG. 9, the array substrate 400 includes a plurality of pixel units 401 disposed in an array. Each pixel unit includes at least one organic light-emitting diode and a thin film transistor connected with the organic light-emitting diode, and the organic light-emitting diode is driven to emit light by the thin film transistor. The thin film transistor can adopt the thin film transistor provided by embodiments of the present disclosure.

The array substrate can further include a data driving circuit 6 and a gate driving circuit 7. The data driving circuit 6 is configured to provide a data signal, and the gate driving circuit 7 is configured to provide a san signal (such as a signal Vscan) and to further provide kinds of control signals. The data driving circuit 6 is connected with the pixel unit 401 through a data line 61 and the gate driving circuit 7 is connected with the pixel unit 401 through a gate line 71. The data driving circuit 6 and the gate driving circuit 7 both include a thin film transistor, and, for example, the thin film transistor can adopt the thin film transistor provided by embodiments of the present disclosure.

The advantages of the array substrate provided by embodiments of the present disclosure are same with the advantages of the above mentioned thin film transistor, which is not repeated here.

For example, the base substrate 10 of the array substrate is a flexible substrate.

The thin film transistor in the array substrate provided by embodiments of the present disclosure can be manufactured in a low-temperature environment, so the base substrate of the array substrate can be the flexible substrate. In this way, the array substrate can be applied in the flexible display panel and an application range of the array substrate is increased.

Embodiments of the present disclosure further provide a display panel which includes the above mentioned array substrate.

The display panel can be applied in any product or component having a display function such as a liquid crystal display device, a liquid crystal television, a digital photo frame, a cell phone or a tablet computer.

The advantages of the display panel provided by embodiments of the present disclosure are same with the advantages of the above mentioned array substrate, which is not repeated here.

For example, the display panel is a liquid crystal display panel or an organic light-emitting diode display panel.

In a case that the display panel is the liquid crystal display (LCD) panel, the display panel includes an array substrate, an opposite substrate and a liquid crystal layer disposed between the array substrate and the opposite substrate. The array substrate includes the above mentioned thin film transistor and a pixel electrode electrically connected with the drain electrode 40 of the thin film transistor, or the array substrate can further include a common electrode. For example, the opposite substrate includes a black matrix and a color filter. In the embodiments of the present disclosure, the color filter can be disposed in the opposed substrate or can be disposed in the array substrate. The common electrode can be disposed in the array substrate or can be disposed in the opposite substrate.

In a case that the display panel is the organic light-emitting diode (OLED) display panel, the display panel includes an array substrate and an encapsulation substrate. The array substrate includes the above mentioned thin film transistor and an anode electrically connected with the drain electrode of the thin film transistor, a cathode and an organic material function layer disposed between the anode and the cathode.

What are described above is related to the illustrative embodiments of the disclosure only and not limitative to the scope of the disclosure; the scopes of the disclosure are defined by the accompanying claims.

The application claims priority to the Chinese patent application No. 201710313626.1 filed on May 5, 2017, the entire disclosure of which is incorporated herein by reference as part of the present application.

What is claimed is:

1. A thin film transistor, comprising an active layer, a source electrode, a drain electrode, a gate electrode and a gate insulating layer,
    wherein the active layer comprises a source region, a drain region and a channel region, the source region and the drain region comprise a first metal material, and the channel region comprises a semiconductor material which is obtained from oxidation of the first metal material;
    the thin film transistor further comprises a source contact region and a drain contact region, and the source contact region and the drain contact region are respectively electrically connected with the source region and the drain region;
    the source contact region and the drain contact region comprise a second metal material, and the gate insulating layer comprises an insulating material which is obtained from oxidation of the second metal material,
    wherein the source contact region, the drain contact region and the gate insulating layer are provided in a one-piece manner and formed from the second metal material.

2. The thin film transistor according to claim 1, wherein the source region, the drain region and the channel region are provided in a one-piece manner and formed from the first metal material.

3. The thin film transistor according to claim 1, further comprising a passivation layer, wherein the passivation layer is on a side of the gate electrode away from the gate insulating layer, and the source electrode and the drain electrode are respectively electrically connected with the source contact region and the drain contact region through via holes passing through the passivation layer.

4. The thin film transistor according to claim 1, wherein the second metal material comprises aluminum, titanium, tantalum, hafnium or zirconium; or the second metal material comprises an alloy material comprising aluminum, titanium, tantalum, hafnium or zirconium.

5. The thin film transistor according to claim 1, wherein the first metal material comprises indium, zinc, tin, copper, nickel, titanium or tungsten; or the first metal material comprises an alloy material comprising indium, zinc, tin, copper, nickel, titanium or tungsten.

6. An array substrate, comprising the thin film transistor according to claim 1.

7. A display panel, comprising the array substrate according to claim 6.

8. A manufacturing method of a thin film transistor, comprising:

forming an active layer, a source electrode, a drain electrode, a gate electrode and a gate insulating layer, wherein forming the active layer comprises:

forming a source region, a drain region, and a channel region between the source region and the drain region, wherein the source region and the drain region comprise a first metal material, and the channel region comprises a semiconductor material which is obtained from oxidation of the first metal material; and forming a source contact region and a drain contact region, wherein the source contact region and the drain contact region are respectively electrically connected with the source region and the drain region;

the source contact region and the drain contact region comprise a second metal material, and the gate insulating layer comprises an insulating material which is obtained from oxidation of the second metal material; and the source contact region, the drain contact region and the gate insulating layer are provided in a one-piece manner and formed from the second metal material.

\* \* \* \* \*